United States Patent
Takahashi et al.

(10) Patent No.: US 9,391,031 B2
(45) Date of Patent: Jul. 12, 2016

(54) METHOD FOR MANUFACTURING ELECTRONIC DEVICE AND ELECTRONIC DEVICE

(71) Applicant: FUJITSU LIMITED, Kawasaki-shi, Kanagawa (JP)

(72) Inventors: Tetsuya Takahashi, Nagano (JP); Yasuo Moriya, Kawasaki (JP); Kimio Nakamura, Suzaka (JP)

(73) Assignee: FUJITSU LIMITED, Kawasaki (JP)

( * ) Notice: Subject to any disclaimer, the term of this patent is extended or adjusted under 35 U.S.C. 154(b) by 67 days.

(21) Appl. No.: 13/922,332

(22) Filed: Jun. 20, 2013

(65) Prior Publication Data
US 2014/0084491 A1   Mar. 27, 2014

(30) Foreign Application Priority Data
Sep. 21, 2012   (JP) ................. 2012-208833

(51) Int. Cl.
H01L 23/00   (2006.01)

(52) U.S. Cl.
CPC ............... *H01L 24/03* (2013.01); *H01L 24/07* (2013.01); *H01L 24/81* (2013.01); *H01L 24/83* (2013.01); *H01L 24/92* (2013.01); *H01L 24/13* (2013.01); *H01L 24/16* (2013.01); *H01L 24/29* (2013.01); *H01L 24/32* (2013.01); *H01L 24/73* (2013.01); *H01L 2224/131* (2013.01); *H01L 2224/16238* (2013.01); *H01L 2224/2919* (2013.01); *H01L 2224/32225* (2013.01); *H01L 2224/73204* (2013.01); *H01L 2224/75314* (2013.01); *H01L 2224/81191* (2013.01); *H01L 2224/81204* (2013.01); *H01L 2224/81208* (2013.01); *H01L 2224/81815* (2013.01); *H01L 2224/83192* (2013.01); *H01L 2224/83204* (2013.01); *H01L 2224/83209* (2013.01); *H01L 2224/83856* (2013.01); *H01L 2224/83862* (2013.01); *H01L 2224/92242* (2013.01)

(58) Field of Classification Search
CPC .......... H01L 24/07; H01L 24/03; H01L 24/92
USPC ........................... 257/783; 438/108, 118, 124
See application file for complete search history.

(56) References Cited

U.S. PATENT DOCUMENTS

2009/0230552 A1*   9/2009   Pendse ......................... 257/737
2011/0237028 A1*   9/2011   Hamazaki et al. ............ 438/108
2012/0255766 A1    10/2012  Igarashi

FOREIGN PATENT DOCUMENTS

| JP | 2000-286297 A | 10/2000 |
| JP | 2000-306927 A | 11/2000 |
| JP | 2004-288768 A | 10/2004 |
| JP | 2010-226140 A | 10/2010 |

OTHER PUBLICATIONS

Japan Patent Office, Office Action for corresponding Japanese Patent Application No. 2012-208833, Jan. 19, 2016.

*Primary Examiner* — William Harriston
(74) *Attorney, Agent, or Firm* — Squire Patton Boggs (US) LLP

(57) ABSTRACT

A method for manufacturing an electronic device, the method includes: applying an adhesive film on a package board; placing an electronic component on the package board with a bump therebetween; applying a first load to the electronic component while heating the electronic component to a first temperature higher than a reaction start temperature of the adhesive film and lower than a melting point of the bump; reducing the first load to a second load lower than the first load while maintaining the first temperature; and heating the electronic component to a second temperature higher than or equal to the melting point of the bump while maintaining the second load.

7 Claims, 8 Drawing Sheets

METHOD FOR MANUFACTURING ELECTRONIC DEVICE AND ELECTRONIC DEVICE

CROSS-REFERENCE TO RELATED APPLICATION

This application is based upon and claims the benefit of priority of the prior Japanese Patent Application No. 2012-208833, filed on Sep. 21, 2012, the entire contents of which are incorporated herein by reference.

FIELD

The embodiments discussed herein are related to methods for manufacturing electronic devices.

BACKGROUND

In mount reflow (MR) soldering, which is a technique for mounting a semiconductor chip with solder bumps, solder bumps coated with a flux are placed on a package board and are reflowed in a reflow oven. In local reflow (LR) soldering, solder bumps are reflowed using a flip chip bonder.

The related art is disclosed in Japanese Laid-open Patent Publication Nos. 2004-288768 and 2010-226140.

SUMMARY

According to one aspect of the embodiments, a method for manufacturing an electronic device, the method includes: applying an adhesive film on a package board; placing an electronic component on the package board with a bump therebetween; applying a first load to the electronic component while heating the electronic component to a first temperature higher than a reaction start temperature of the adhesive film and lower than a melting point of the bump; reducing the first load to a second load lower than the first load while maintaining the first temperature; and heating the electronic component to a second temperature higher than or equal to the melting point of the bump while maintaining the second load.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Multifunctional thin semiconductor chips are used in semiconductor packages such as package-on-package (PoP). Such multifunctional semiconductor chips may have large chip sizes.

When a large and thin semiconductor chip is mounted by MR soldering, the warpage of the semiconductor chip during reflow may increase, for example, in the direction in which the semiconductor chip becomes concave, with the functional surface thereof facing downward. For example, if an organic package board is used, the difference in linear thermal expansion coefficient between the semiconductor chip and the package board may make it difficult to connect them by reflow. The warpage of semiconductor chips may result in mounting defects as the thickness thereof decreases from the range of 70 to 100 µm to the range of 40 to 50 µm.

To reduce the warpage of semiconductor chips, LR soldering is employed. LR soldering, however, may decrease the productivity because it takes 50 to 60 seconds per chip.

In MR soldering and LR soldering, an ultralow-k (ULK) material, which is a low-dielectric-constant material, is used for an interlayer dielectric formed between interconnects on a semiconductor chip. When a semiconductor chip is mounted on an organic package board, the difference in linear thermal expansion coefficient between the semiconductor chip and the package board may result in cracking of the interlayer dielectric, containing an ULK material, on the semiconductor chip.

For example, in the case of adhesive precoating, a semiconductor chip is mounted on a package board precoated with an adhesive. For adhesive precoating, the adhesive remains in a high-viscosity (gelled) state for a very short period of time as it changes from a low-viscosity state to a cured state. This may result in collapse and flowing of solder bumps due to the low-viscosity state of the adhesive or bonding defects due to the high-viscosity state of the adhesive. In the low-viscosity state of the adhesive, the flux component may react and form voids.

As an electronic device, a semiconductor device including a semiconductor chip flip-chip bonded to a package board in a face-down manner may be used.

Figure 1A:
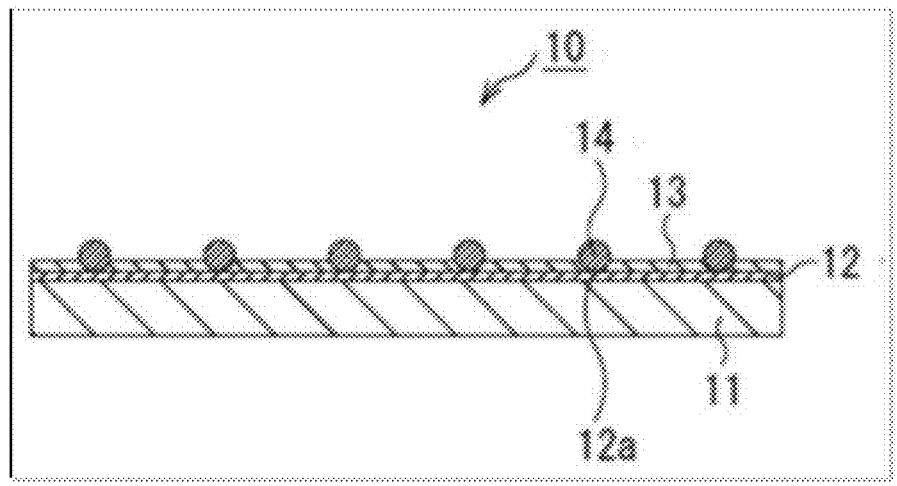
FIG. 1A illustrates an example of a semiconductor chip.

FIG. 1A illustrates an example of a semiconductor chip. A semiconductor chip 10 includes a semiconductor substrate 11, such as a silicon substrate, a device layer 12, and a protective layer 13.

The device layer 12 includes devices, such as CMOS transistors and semiconductor memories, formed on the surface of the semiconductor substrate 11, an interlayer dielectric covering the devices, and interconnects. The protective layer 13 may be an insulating layer that protects the surface of the device layer 12. The device layer 12 has a plurality of electrode pads 12a on which solder bumps 14 for flip-chip bonding are provided.

Figure 1B:
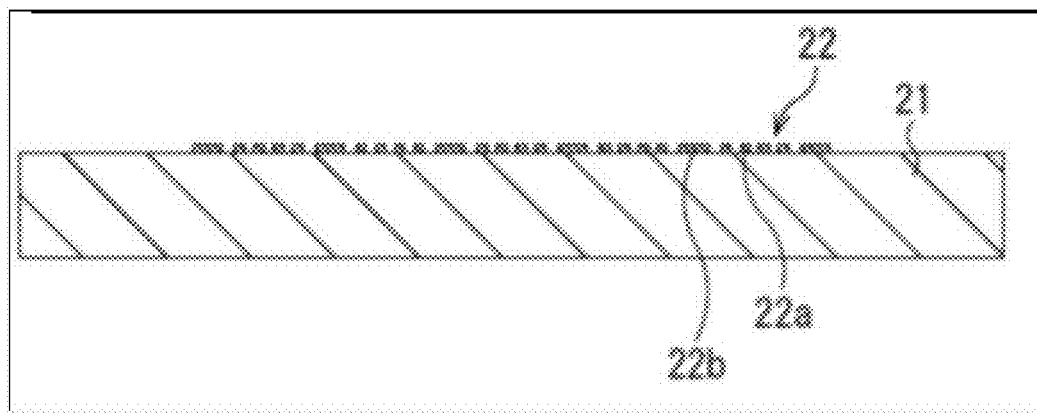
FIG. 1B illustrates an example of a package board.
Figure 1C:
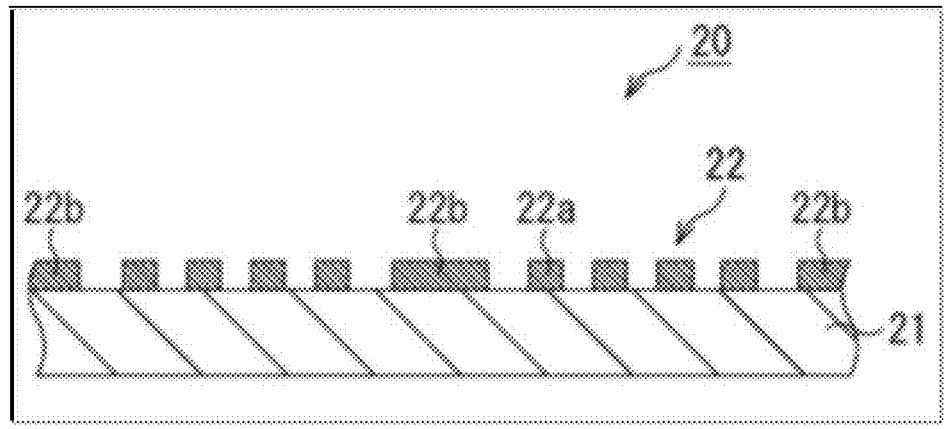
FIG. 1C illustrates a package board.

FIGS. 1B and 1C illustrate an example of a package board. FIG. 1C is a partial enlarged view of FIG. 1B. A package board 20 includes a substrate 21, such as a polyimide substrate, and an interconnect structure 22.

The interconnect structure 22 is formed on the surface of the substrate 21. The interconnect structure 22 includes a line-and-space pattern of interconnects 22a and connection electrodes 22b to which the solder bumps 14 are connected at predetermined positions between the interconnects 22a.

Figure 2:
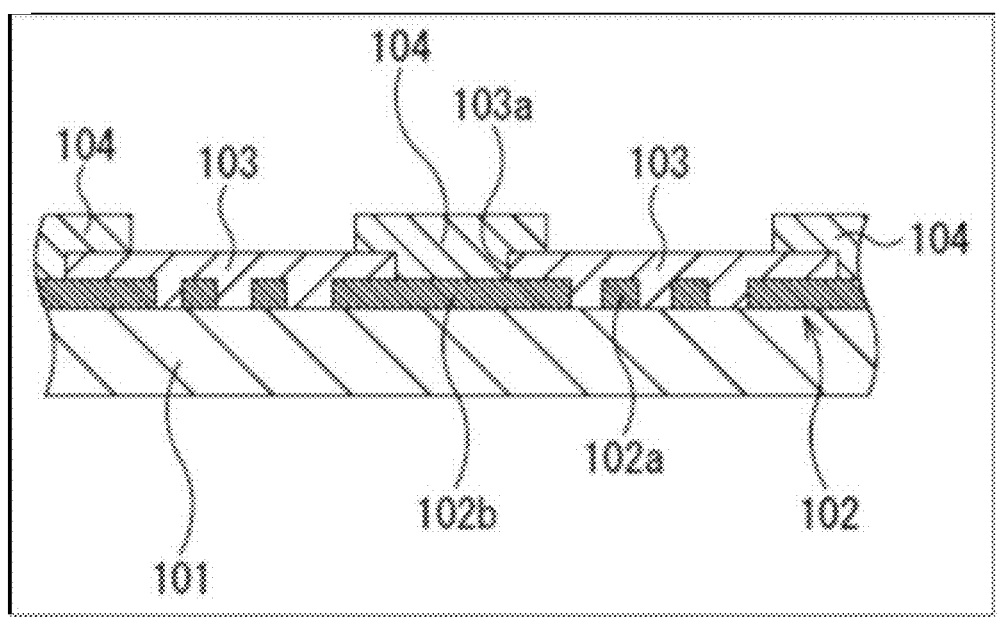
FIG. 2 illustrates an example of a package board.

FIG. 2 illustrates an example of a package board. In FIG. 2, there is illustrated a package board 101 for face-down flip-chip bonding. The package board 101 includes a solder resist 103 covering interconnects 102a of an interconnect structure 102. The package board 20 illustrated in FIG. 1C may include no solder resist. The package board 101 illustrated in FIG. 2 includes connection portions 104 that fill openings 103a formed in the solder resist 103 where connection electrodes 102b of the interconnect structure 102 are exposed, and solder bumps are connected to the connection portions 104. The package board 20 illustrated in FIG. 1C may include no connection portions 104.

Figure 3A:
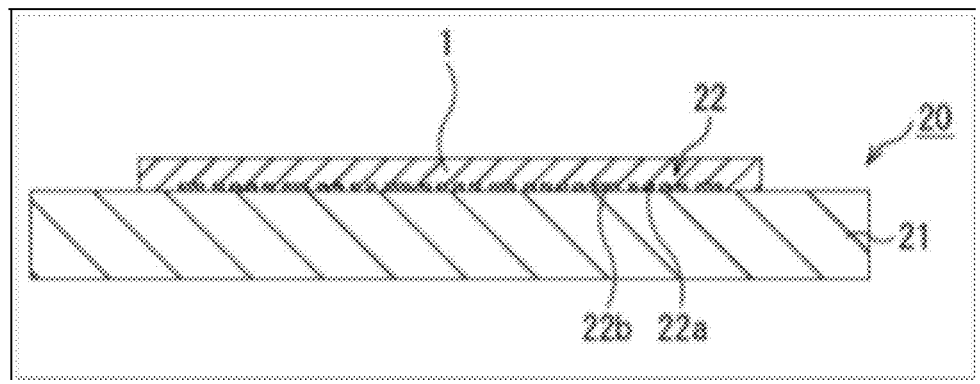
FIGS. 3A to 3C illustrate an example of a method for manufacturing a semiconductor device.
Figure 3B:
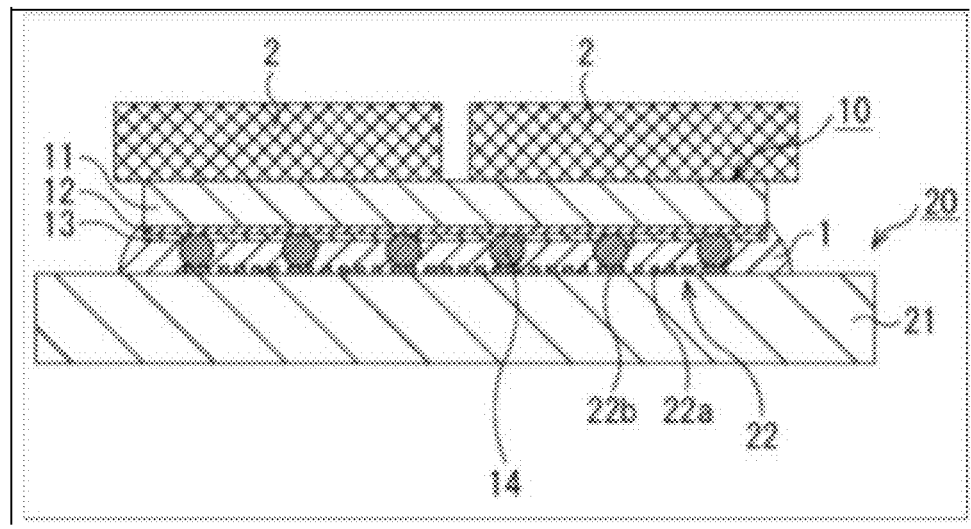
Figure 3C:
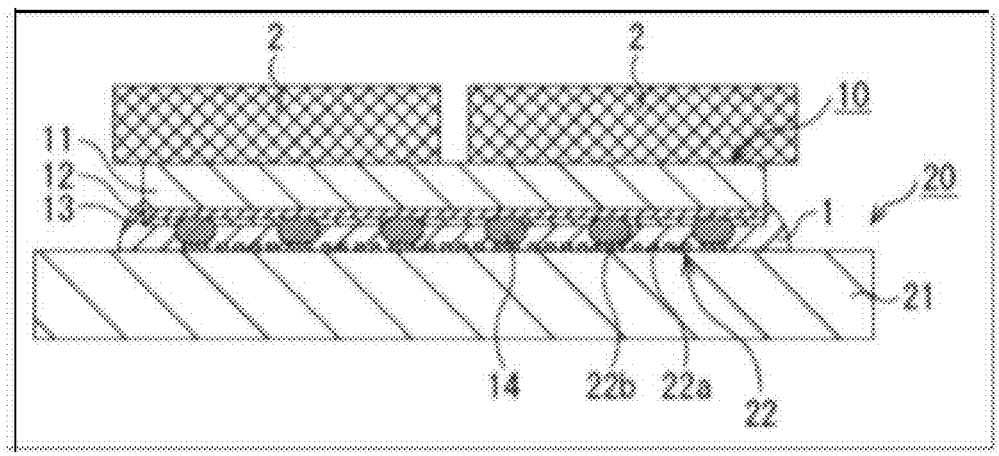
Figure 4:
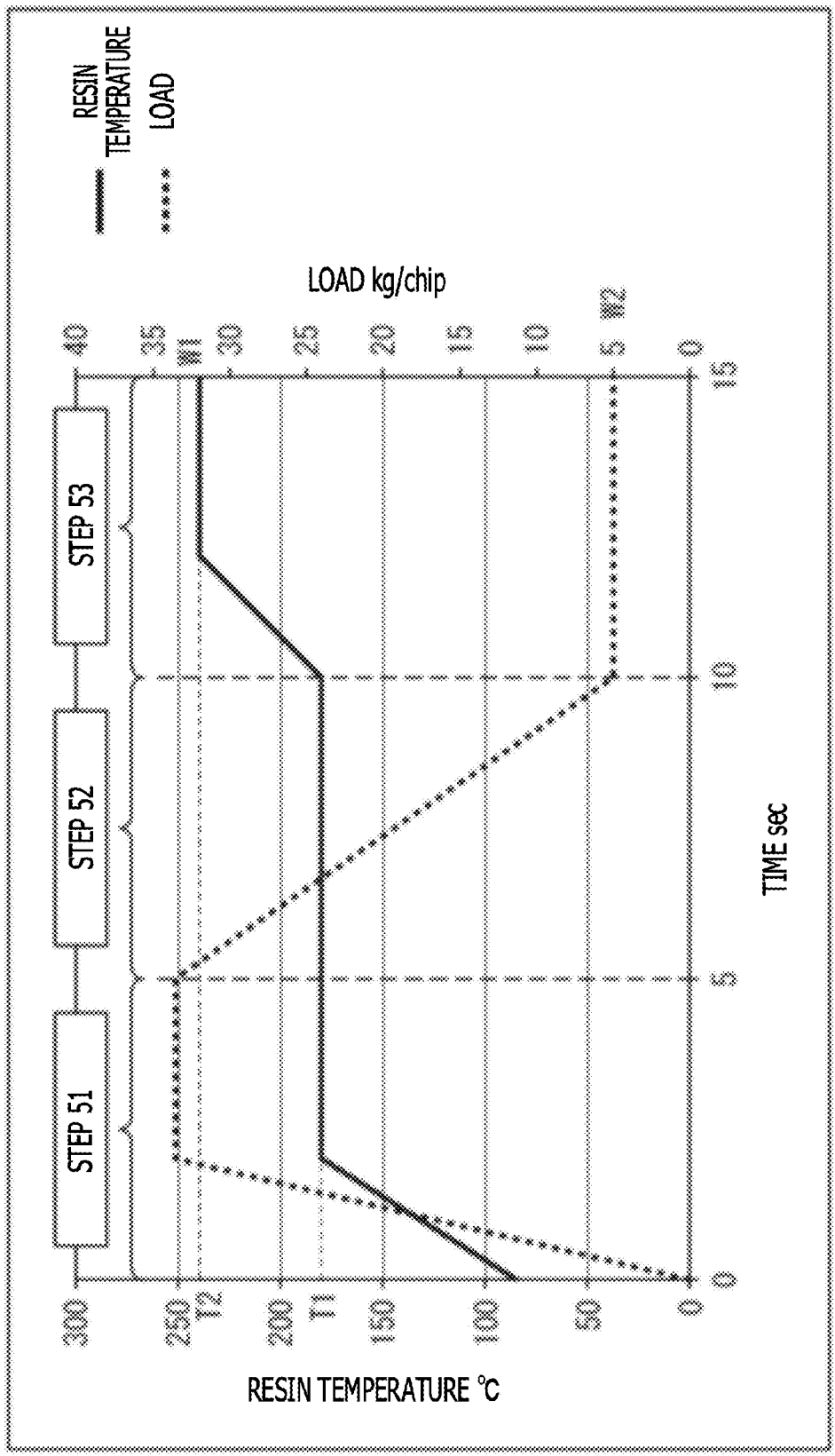
FIG. 4 illustrates an example of a graph of a temperature of and a bonding load on an adhesive film.

FIGS. 3A to 3C illustrate an example of a method for manufacturing a semiconductor device. FIG. 4 illustrates an example of a graph of the temperature of and the bonding load on an adhesive film. In FIG. 4, there is illustrated the temperature of and the bonding load on an adhesive film during the manufacturing process of a semiconductor device illustrated in FIGS. 3A to 3C. As illustrated in FIG. 3A, an adhesive film 1 is laminated on the surface of the package board 20. The adhesive film 1 is laminated under a pressure of 0.5 MPa or higher at a temperature at which the viscosity of the adhesive film 1 decreases to a suitable level, for example, 80° C. or higher, in a vacuum of, for example, 10 kPa or lower. This may allow successful lamination without forming voids in the adhesive film 1.

The adhesive film 1 may be a non-conductive film (NCF) containing a non-conductive resin such as a thermosetting epoxy resin. The adhesive film 1 may contain at least one of acid anhydrides and organic acids as a flux component. The at least one of acid anhydrides and organic acids contained in the adhesive film 1 may be microencapsulated. The acid anhydride contained in the adhesive film 1 may be at least one of methyltetrahydrophthalic anhydride, tetrahydrophthalic anhydride, methylnadic anhydride, hexahydrophthalic anhydride, and methylhexahydrophthalic anhydride. The organic acid contained in the adhesive film 1 may be at least one of unsaturated carboxylic acids, aromatic carboxylic acids, and dicarboxylic acids.

The adhesive film 1 is solid at room temperature, for example, about 25° C. As the adhesive film 1 is heated from room temperature to the reaction start temperature, for example, about 120° C. to about 130° C., it gradually loses viscosity and becomes liquid. As the adhesive film 1 is further heated above the reaction start temperature, it gradually gains viscosity and becomes semi-solid, exhibiting a viscosity of, for example, about 1,000 to about 10,000 Pa·s.

In step S1, as illustrated in FIG. 3B, the semiconductor chip 10 is positioned on the surface of the package board 20. The semiconductor chip 10 is heated and pressed by a heat pressing tool 2 placed on the back surface thereof such that the solder bumps 14 abut the connection electrodes 22b. In step S1, the semiconductor chip 10 is heated and pressed as illustrated in step S51 in FIG. 4. For example, the semiconductor chip 10 is gradually heated to a first temperature T1 above the reaction start temperature of the adhesive film 1 in about 2 minutes while pressing the semiconductor chip 10 up to a first load W1. The first temperature T1 may be lower than the melting point of the solder bumps 14. The adhesive film 1 is liquid from the start of heating to the reaction start temperature, gradually gains viscosity above the reaction start temperature, and becomes semi-solid at the first temperature T1. In the initial stage of step S1, the rate of increase in the temperature of the adhesive film 1 is low relative to the rate of transfer of the load thereto. Accordingly, the pressure applied by the heat pressing tool 2 is transferred to the solder bumps 14 while the adhesive film 1 remains liquid. This may result in deformation of the solder bumps 14 to a predetermined height. FIG. 3B illustrates the solder bumps 14 immediately before being deformed by pressing. After the first temperature T1 and the first load W1 are reached, the first temperature T1 and the first load W1 are maintained.

In step S1, an antisticking film may be provided on the surface of the heat pressing tool 2, and the semiconductor chip 10 may be heated and pressed by the heat pressing tool 2 with the antisticking film therebetween. The antisticking film reduces sticking of the adhesive film 1 to the heat pressing tool 2 as it becomes liquid and flows outside the semiconductor chip 10 during the mounting of the semiconductor chip 10 on the package board 20, thus allowing initial heat pressing.

In step S2, while the first temperature T1 is maintained, the load is reduced to a second load W2 lower than the first load W1. In step S2, the adhesive film 1 is maintained in a semi-solid state by heating following the heating at the first temperature T1 in the later stage of step S1.

In step S3, while the second load W2 is maintained, the semiconductor chip 10 is heated to a second temperature T2 higher than the melting point of the solder bumps 14. As illustrated in FIG. 3C, while the adhesive film 1 remains semi-solid, the solder bumps 14 melt into a horizontally elongated oval shape to bond the semiconductor chip 10 and the package board 20. After bonding, the adhesive film 1 solidifies as it is cooled to room temperature.

In face-down flip-chip bonding, in which solder bumps melt while the adhesive resin is liquid, the molten solder may scatter and make a short between the solder bumps. If the pressing load is reduced so that less solder scatters, for example, a cold joint may occur, where the resin is held between the solder bumps and the connection electrodes. Because the adhesive film 1 is semi-solid when the solder bumps 14 melt, no solder may scatter when pressed under a predetermined load. The molten solder bumps 14 may therefore allow the semiconductor chip 10 and the package board 20 to be reliably connected electrically and, after the solder bumps 14 solidify, mechanically.

With the adhesive film 1, the solder bumps 14 are used as standoffs in step S1, and the semi-solid adhesive is used as a standoff in step S3. The semiconductor chip 10 may therefore be successfully bonded to the package board 20 without causing collapse or flowing of the solder bumps 14. A large and thin semiconductor chip is mounted on an organic package board, and smaller solder bumps are provided with a higher density. Mounting may be possible in a shorter period of time than by LR soldering, for example, in about 15 seconds per chip. Adhesive precoating is employed; for example, an adhesive is applied to the package board 20 before the semiconductor chip 10 is bonded to the package board 20. This may reduce cracking of the ULK material on the semiconductor chip 10 due to the difference in linear thermal expansion coefficient between the semiconductor chip 10 and the package board 20.

Figure 5A:
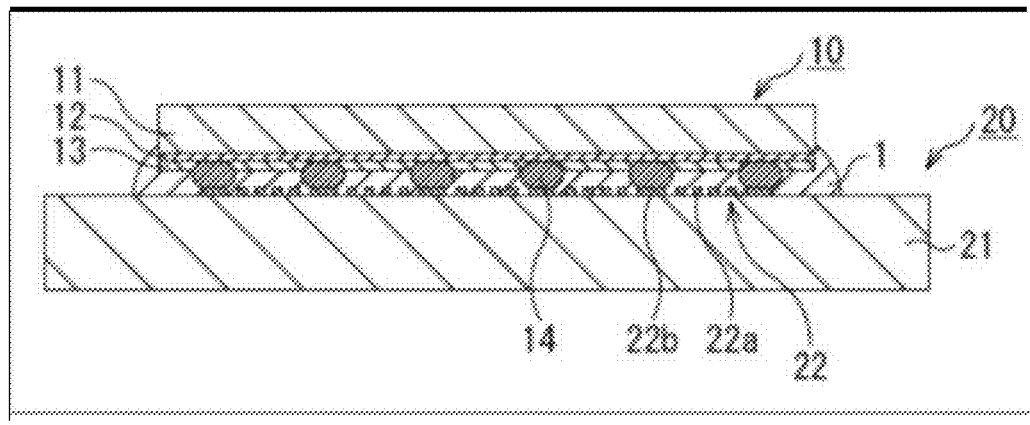
FIGS. 5A and 5B illustrate an example of a semiconductor device.
Figure 5B:
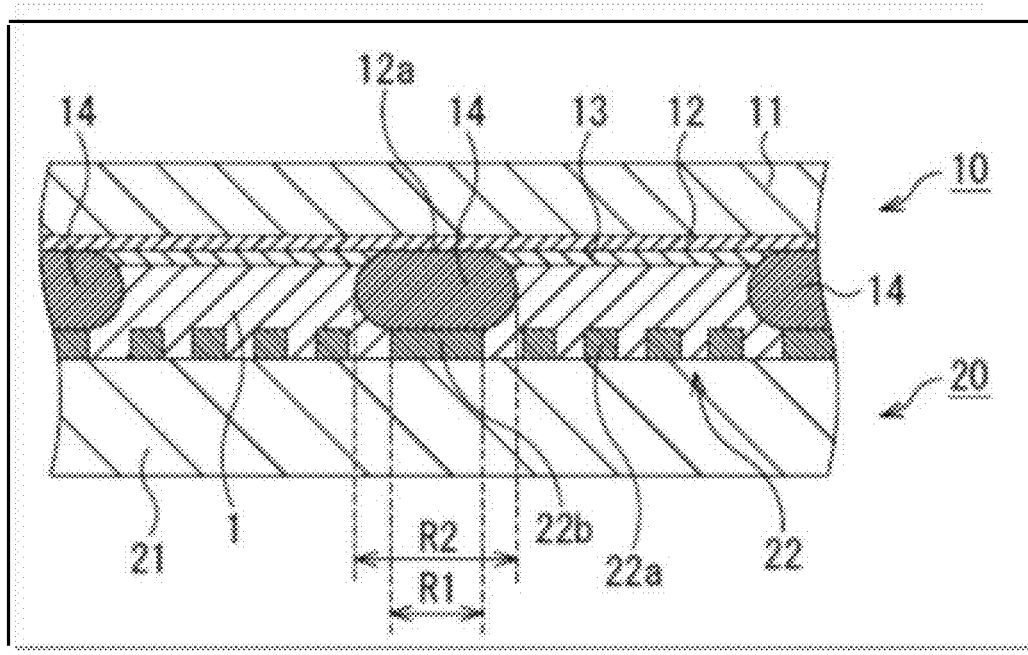

FIGS. 5A and 5B illustrate an example of a semiconductor device. The semiconductor device illustrated in FIGS. 5A and 5B may be manufactured by the method for manufacturing a semiconductor device illustrated in FIGS. 3A to 3C. FIG. 5B is a partial enlarged view of FIG. 5A. The semiconductor chip 10 and the package board 20 are bonded by connecting the electrode pads 12a and the connection electrodes 22b with the solder bumps 14.

Because the solder bumps 14 melt while the adhesive film 1 is semi-solid, as illustrated in step S3 in FIGS. 3A to 3C, no solder resist for flip-chip bonding or connection portions formed on connection electrodes and to which solder bumps are connected may be used. The package board 20 may include no solder resist or connection portions. The adhesive film 1, therefore, directly covers the solder bumps 14 and the connection electrodes 22b on the package board 20 to which the solder bumps 14 are connected and fills the gap between the surface of the semiconductor chip 10 and the surface of the package board 20. This may provide a semiconductor device with a lower profile and a higher packing density.

Figure 6A:
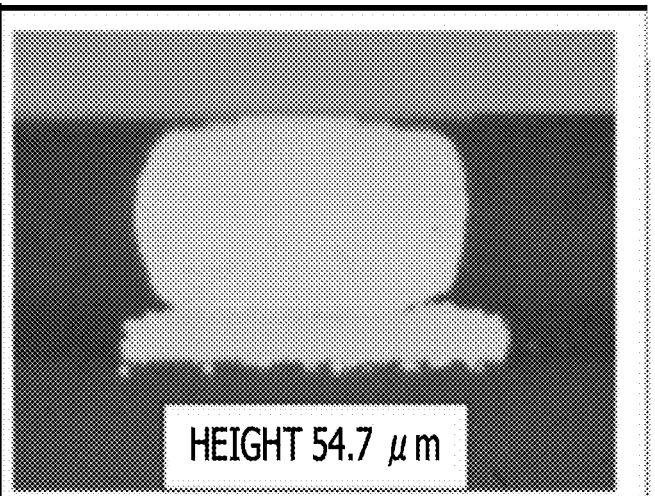
FIGS. 6A and 6B illustrate examples of solder bumps.
Figure 6B:
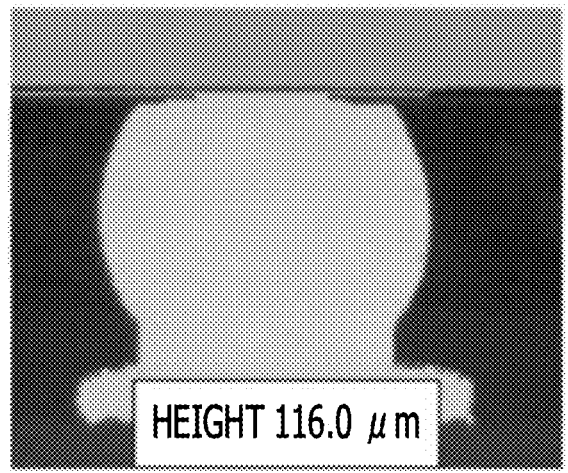

The solder bumps 14 melt into a horizontally elongated oval shape to bond the semiconductor chip 10 and the package board 20. FIGS. 6A and 6B illustrate examples of solder bumps. In FIGS. 6A and 6B, there are illustrated photographs of solder bumps in semiconductor devices. The solder bump illustrated in FIG. 6A may correspond to, for example, the solder bumps illustrated in FIGS. 1A to 1C, FIGS. 3A to 3C, or FIGS. 5A and 5B. The solder bump illustrated in FIG. 6B may be a solder bump used for MR soldering. The solder bump illustrated in FIG. 6A has a predetermined horizontally elongated oval shape with a reduced height, and may have a bump diameter of about 70 µm. This may provide a semiconductor device with a lower profile and a higher packing density. The solder bump illustrated in FIG. 6B has a substantially perfectly spherical shape whose height is more than twice the height of the solder bump illustrated in FIG. 6A, and may have a bump diameter of about 100 µm. As illustrated in FIG. 5B, the land diameter R1 of the connection electrodes 22b is smaller than the bump diameter R2 of the solder bumps 14. Because the land diameter is reduced, the flexibility of interconnect routing on the surface of the package board 20 may be improved, and the number of interconnect layers may be reduced.

The adhesive film 1, which contains a flux component, is laminated without surface treatment. In steps S2 and S3 in FIGS. 3A to 3C, formation of voids may be reduced by reacting the flux component in a high-viscosity state. For example, voids may remain very small without growing.

Figure 7:
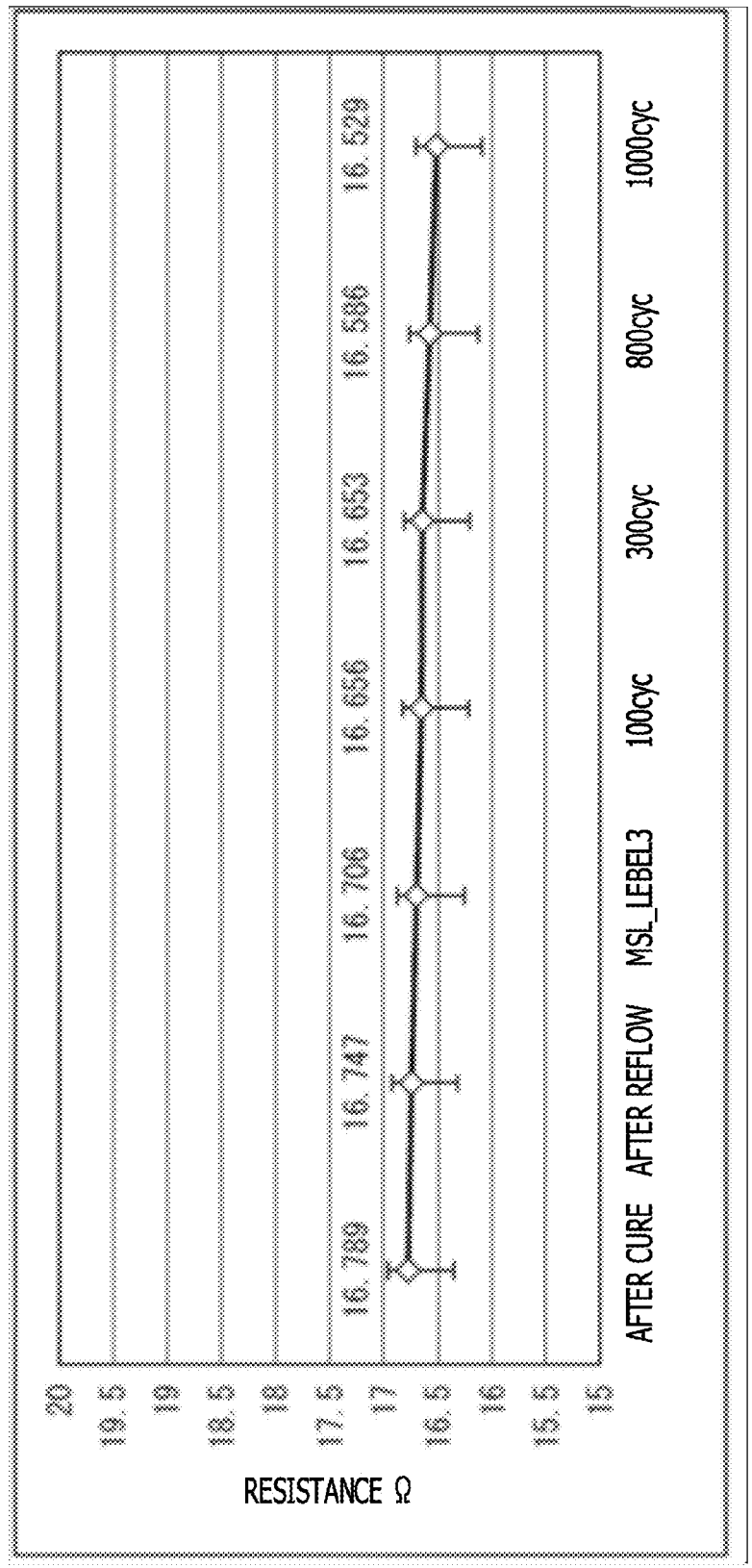
FIG. 7 illustrates an example of results of a reliability test.

FIG. 7 illustrates an example of the results of a reliability test. In FIG. 7, there is illustrated a characteristic graph for a reliability test on the semiconductor device illustrated in FIGS. 1A to 1C, FIGS. 3A to 3C, or FIGS. 5A and 5B. For example, the graph plots the average, maximum, and minimum resistances (Ω) of 10 fabricated sample semiconductor devices. In the reliability test, a temperature cycle (deep thermal cycle: DTC) test was performed after reflow after moisture soak (moisture sensitivity level: MSL). The MSL was JEDEC Level 3 (196 hours at 30° C./60% RH, reflow at 260° C. (max), three times). The DTC test was performed at −55° C./125° C., and no defect occurred after 1,000 cycles. FIG. 7 demonstrates that the semiconductor device exhibits stable resistance throughout the reliability test.

By employing adhesive precoating, the semiconductor chip 10 and the package board 20 may be successfully bonded, and voids in the adhesive may be reduced, so that a highly reliable semiconductor device may be provided.

Figure 8:
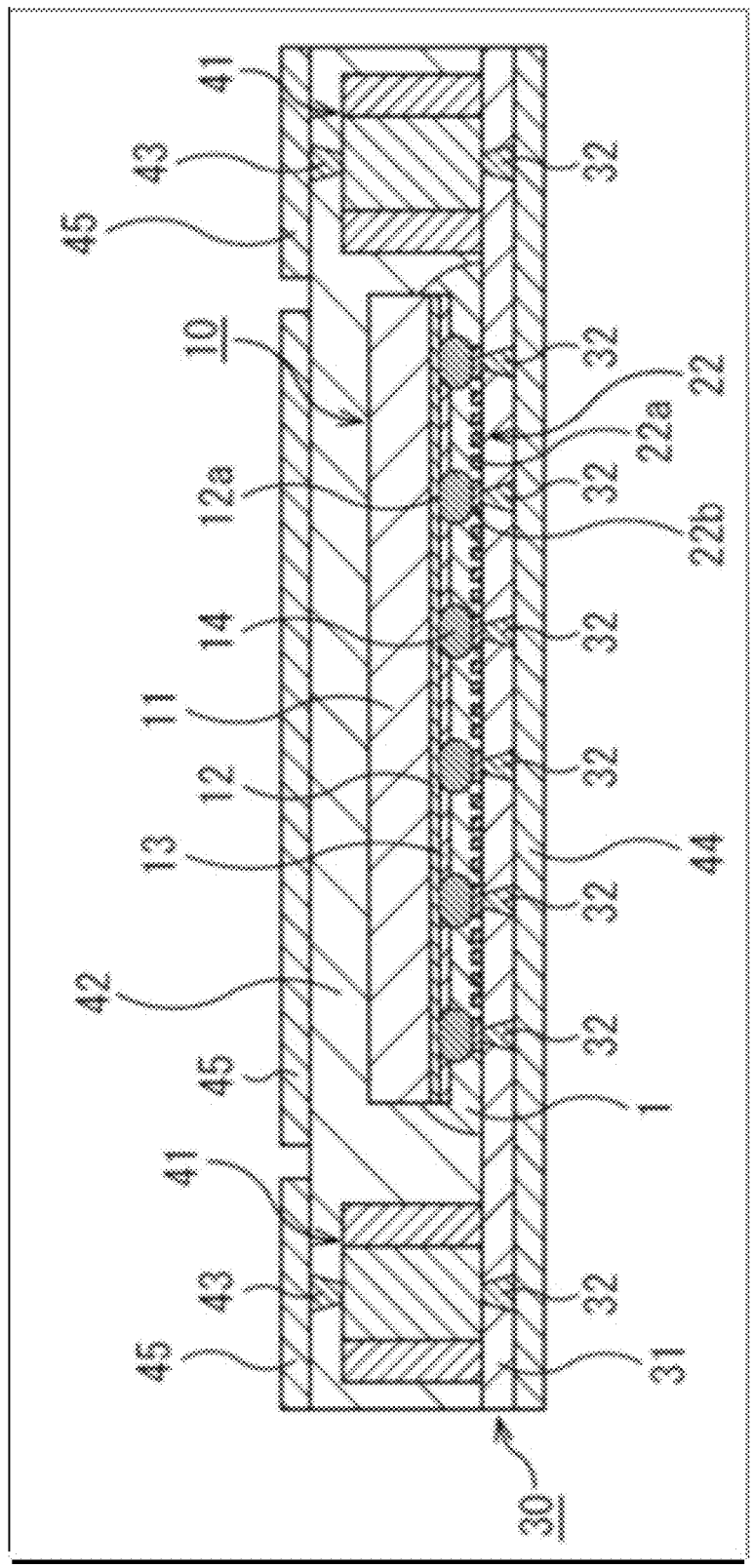
FIG. 8 illustrates an example of a chip-embedded board.

FIG. 8 illustrates an example of a chip-embedded board. As an electronic device, for example, there is illustrated a chip-embedded board incorporating the semiconductor device illustrated in FIGS. 1A to 1C. In FIG. 8, substantially the same or similar elements as in FIGS. 1A to 1C, FIGS. 3A to 3C, or FIGS. 5A and 5B may be labeled with the same designations, and a description thereof may be omitted.

The chip-embedded board incorporates a semiconductor device including a base 30 and the semiconductor chip 10 mounted thereon. The base 30 may correspond to, for example, the package board 20 illustrated in FIGS. 1A to 1C. The base 30 includes a substrate 31, such as a polyimide substrate, and an interconnect structure 22 including interconnects 22a and connection electrodes 22b. In the semiconductor device, the semiconductor chip 10 and the base 30 are electrically and mechanically connected by connecting the electrode pads 12a and the connection electrodes 22b with the solder bumps 14. An adhesive is disposed between the semiconductor chip 10 and the base 30 so as to directly cover and fill the gap between the solder bumps 14, which have a horizontally elongated oval shape, and the connection electrodes 22b. The adhesive may be the adhesive film 1. The semiconductor device may be fabricated by the process illustrated in FIGS. 3A to 3C.

The base 30 has the semiconductor chip 10 and passive devices 41, such as capacitors, mounted on the substrate 31. A resin 42, such as epoxy resin, is charged so as to cover the semiconductor chip 10 and the passive devices 41 mounted on the substrate 31. The substrate 31 has filled vias 32 connected to the connection electrodes 22b at one end thereof and filled vias 32 connected to the passive devices 41 at one end thereof. The resin 42 has filled vias 43 connected to the passive devices 41 at the other thereof. An interconnect layer 44 connected to the filled vias 32 is formed on the back surface, whereas an interconnect layer 45 connected to the filled vias 43 is formed on the front surface.

By employing adhesive precoating, the semiconductor chip 10 and the base 30 may be successfully bonded. There may therefore be provided a highly reliable chip-embedded board with a lower profile and lower manufacturing costs that includes a semiconductor device in which voids in the adhesive are considerably reduced.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A method for manufacturing an electronic device, the method comprising:
    applying an adhesive film on a package board;
    placing an electronic component on the package board with a bump therebetween;
    applying a first load, using a heat pressing tool, to the electronic component from above the electronic component while heating the electronic component to a first temperature higher than a reaction start temperature of the adhesive film and lower than a melting point of the bump so as to make the bump a horizontally elongated oval shape;
    reducing the first load to a second load lower than the first load and larger than zero while maintaining the first temperature; and
    heating the electronic component to a second temperature higher than or equal to the melting point of the bump while maintaining the second load so as to maintain the horizontally elongated oval shape of the bump,
    wherein the heating of the electronic component to the second temperature starts at substantially the same timing as when the load applied to the electronic component reaches the second load from the first load.

2. The method according to claim 1, wherein the adhesive film is solid at room temperature, is liquid up to the reaction start temperature lower than the first temperature, and is semi-solid at the first and second temperatures.

3. The method according to claim 1, wherein the adhesive film directly covers the bump and a connection electrode on the package board to which the bump is coupled and fills a gap between the electronic component and the package board.

4. The method according to claim 3, wherein the connection electrode has a smaller width than the bump.

5. The method according to claim 1, wherein the bump deforms into the horizontally elongated oval shape having a desired height by the first load, and maintains the horizontally elongated oval shape by the second load.

6. The method according to claim 1, wherein the adhesive film contain at least one of acid anhydrides and organic acids as a flux component.

7. The method according to claim 1, wherein an antisticking film is provided on the surface of the heat pressing tool.

* * * * *